United States Patent [19]
Lee et al.

[11] Patent Number: 5,754,979
[45] Date of Patent: May 19, 1998

[54] RECORDING METHOD AND APPARATUS OF AN AUDIO SIGNAL USING AN INTEGRATED CIRCUIT MEMORY CARD

[75] Inventors: Young-man Lee, Suwon; Eun-sang Park, Seoul, both of Rep. of Korea

[73] Assignee: Samsung Electronics Co., Ltd., Kyungki-do, Rep. of Korea

[21] Appl. No.: 719,625

[22] Filed: Sep. 25, 1996

[30] Foreign Application Priority Data

Sep. 30, 1995 [KR] Rep. of Korea ............... 95-33966
Sep. 30, 1995 [KR] Rep. of Korea ............... 95-33968

[51] Int. Cl.$^6$ ............................................. G10L 9/00
[52] U.S. Cl. ................................................. 704/278
[58] Field of Search ........................... 704/201, 278; 364/400.01

[56] References Cited

U.S. PATENT DOCUMENTS

| | | | |
|---|---|---|---|
| 4,701,937 | 10/1987 | Wan et al. | 375/242 |
| 5,379,153 | 1/1995 | Ishii et al. | 360/27 |
| 5,479,559 | 12/1995 | Fette et al. | 704/207 |
| 5,606,643 | 2/1997 | Balasubramanian et al. | 704/243 |
| 5,617,383 | 4/1997 | Matsumoto et al. | 369/32 |

FOREIGN PATENT DOCUMENTS

0 165 604  12/1985  European Pat. Off. ........... G06F 3/16
0 753 855   1/1997  European Pat. Off. ........... G11C 7/00

*Primary Examiner*—Allen R. MacDonald
*Assistant Examiner*—Susan Wieland
*Attorney, Agent, or Firm*—Sughrue, Mion, Zinn, Macpeak & Seas, PLLC

[57] ABSTRACT

The present invention relates to a method and apparatus for recording an audio signal on an integrated circuit (IC) memory card. The audio signal to be recorded is considered to have plural chapters (i.e., songs, or distinct movements) with a mute section (i.e., moment of silence of at least a predetermined length) between each adjoining chapter in the audio signal to be recorded. The present invention provides for automatic partitioning between the chapters as they are recorded on a data area of the IC memory card even when the audio signal is recorded continuously based upon a single press of the record button and terminated with a single press of the stop button. Since the chapters of the recorded audio signal are automatically partitioned, without need for starting and stopping of the recording process by a user, a recording is conveniently made on the IC memory card which allows random access to any one of the chapters for playback. Also, the present invention provides for the function of editing the table-of-contents (TOC) area of the IC memory card so as to correct the partitioning information recorded in the TOC area of the IC memory card.

7 Claims, 9 Drawing Sheets

| 0000 H | ? |
|---|---|
| 0001 H | 0800 |
| 0002 H | 0010H |
| 0003 H | 0835 |
| 0004 H | 0100H |
| 0005 H | 0435 |
| 0006 H | |
| 0007 H | |
| ... | .... |
| 000E H | |
| 000F H | |

| 0000 H | 3 |
|---|---|
| 0001 H | 0A00 |
| 0002 H | 0010H |
| 0003 H | 0325 |
| 0004 H | 0100H |
| 0005 H | 0435 |
| 0006 H | 0200H |
| 0007 H | 0200 |
| ⋮ | ⋮ |
| 000E H | |
| 000F H | |

FIG. 6B

| 0000 H | 2 |
|---|---|
| 0001 H | 0A00 |
| 0002 H | 0010H |
| 0003 H | 0325 |
| 0004 H | 0100H |
| 0005 H | 0635 |
| 0006 H | |
| 0007 H | |
| ⋮ | ⋮ |
| 000E H | |
| 000F H | |

RECORDING METHOD AND APPARATUS OF AN AUDIO SIGNAL USING AN INTEGRATED CIRCUIT MEMORY CARD

BACKGROUND OF THE INVENTION

1. Field of the Invention

The present invention relates to a recording method and apparatus of an audio signal using an integrated circuit (IC) memory card, and more particularly to a recording method and apparatus of an audio signal using an IC memory card, capable of partitioning chapters based on detection of a mute section of the audio signal, directly selecting a desired chapter by storing record information of respective chapters in a table-of-contents (TOC) area, and consolidating adjoining chapters into a single chapter if necessary.

The present application for a recording method and apparatus is based on Korean Application No. 95-33966, which is incorporated by references herein for all purposes.

2. Description of the Related Art

There are a data area and a table-of-contents (TOC) area in an IC memory card. The data area includes audio signal data and the TOC area includes recording information regarding the data stored in the data area, such as start addresses, recording time, etc.

A general IC memory card recording apparatus records audio signals on the IC memory card. Recording is begun by pressing a recording key and is stopped by pressing a stop key at a point of time when recording operation is to be stopped. Conventionally, a controller of this system designates, as one chapter, data recorded during input operation between the time a recording key and the time a stop key is pressed, and stores recording information of one chapter in the TOC area. The recording information in the TOC area includes the start addresses and recording times of respective chapters, and total recording time of data recorded in the IC memory card.

In the case where such a conventional system records the whole of a specific audio source at a time, the whole audio source is recorded as a single chapter by once operating the recording key and stop key. For example, if the whole contents recorded on a compact disc (CD) or a magnetic tape are recorded by once operating the recording key and stop key, a plurality of chapters (i.e., songs or distinct movements of a musical composition) recorded thereon are recorded on the IC memory card as one chapter, thereby making it difficult, if not impossible, to select a desired specific chapter.

Of course, the above problem can be solved by starting and stopping the recording operation for the IC memory card for every chapter with respect to a plurality of chapters recorded on the source medium (e.g., compact disc or magnetic tape). However, there causes a drawback in that a user is then required to repeat the operation of the stop key and the recording key for every chapter up to the final chapter.

SUMMARY OF THE INVENTION

Therefore, in order to solve the above problem, it is an object of the present invention to provide a recording method, capable of partitioning and recording each chapter, even though a plurality of chapters are recorded at a time.

Another object of the present invention is to provide a recording apparatus to embody the recording method in accordance with the present invention.

To accomplish the above object of the present invention, there is provided a method of recording, on an integrated circuit (IC) memory card, an audio signal having a period of silence (or a mute section) between adjoining chapters, the recording method comprising the steps:

(a) recording an audio signal of a first chapter in the audio signal in a data area of the IC memory card;

(b) detecting whether a mute section in the audio signal is maintained during a predetermined time in the step (a);

(c) stopping recording of the first chapter when the mute section is detected in the step (b), and recording information of the first chapter in a table-of-contents (TOC) area of the IC memory card; and (d) partitioning each chapter, recording the audio signal of each chapter in the data area, and recording the recording information of each chapter in the TOC area, by the repetition of process in the steps (a), (b) and (c) with regard to the audio signals of subsequent chapters until the audio signals of all chapters are recorded after performing the step (c).

To accomplish another object of the present invention, there is provided an apparatus for recording, on an integrated circuit (IC) memory card, an audio signal having a mute section between adjoining chapters, the recording apparatus comprising:

detection means for detecting a mute section of the audio signal; recording means for recording a converted audio signal in a data area of the IC memory card by converting the audio signal according to whether or not the mute section is detected, and recording information on the audio signal recorded in the data area of the IC memory card in a table-of-contents (TOC) area of the IC memory card; and control means for controlling an operation of the recording means according to a predetermined input signal and a result of detection of the mute section.

BRIEF DESCRIPTION OF THE DRAWINGS

The above object of the present invention will become more apparent by describing in detail preferred embodiments thereof with reference to the attached drawings in which.

DETAILED DESCRIPTION OF THE PREFERRED EMBODIMENT

A preferred embodiment of the present invention will be described below in more detail with reference to the accompanying drawings.

Figure 1:
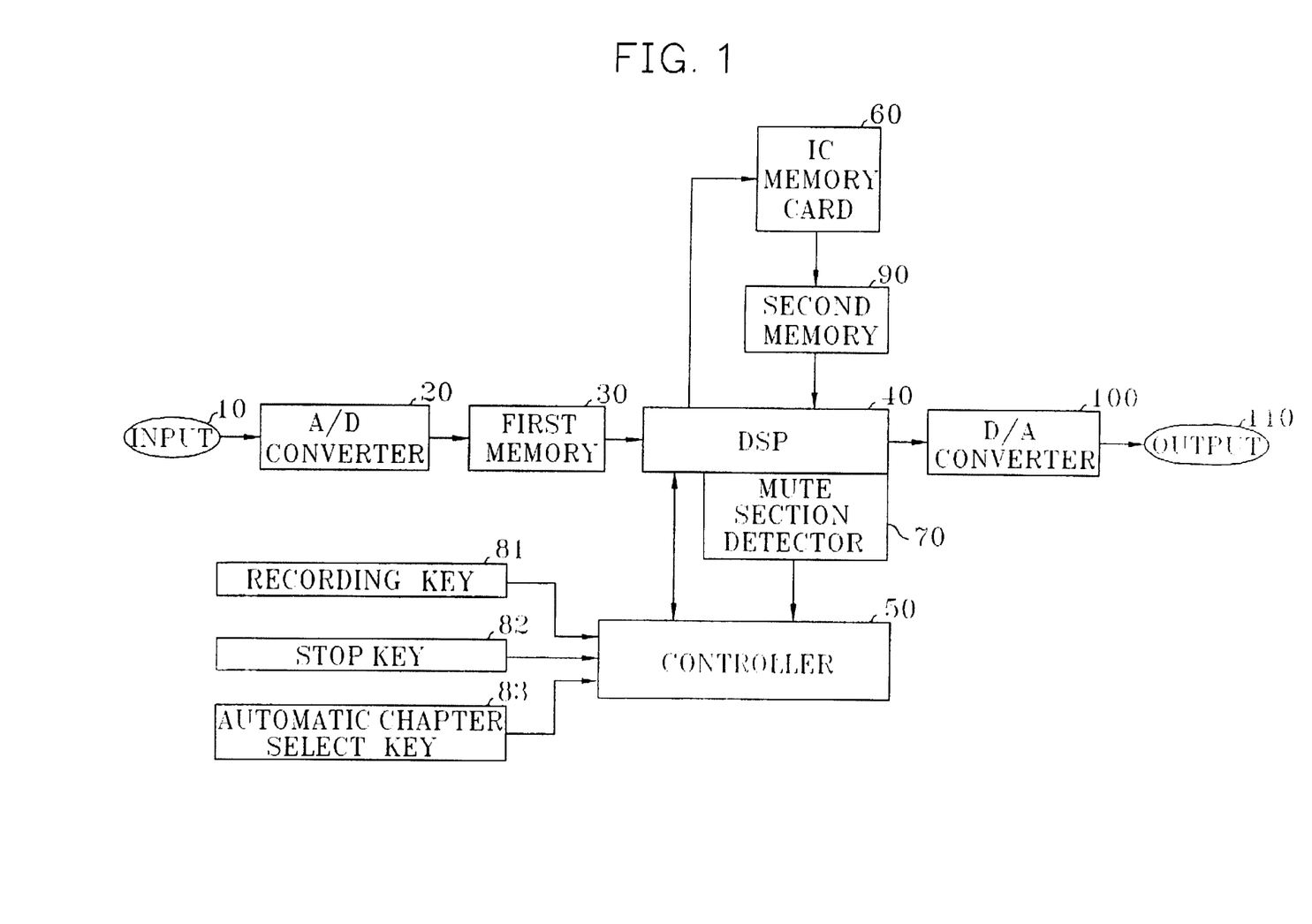
FIG. 1 is a block diagram showing a recording apparatus of an audio signal, using an integrated circuit (IC) memory card in accordance with one embodiment of the present invention.

FIG. 1 is a block diagram showing a recording apparatus of an audio signal, using an integrated circuit (IC) memory card in accordance with the present invention. The FIG. 1 apparatus includes an input unit 10, which is a kind of an input end for inputting audio signals recorded on a record medium, such as a compact disc (CD), a magnetic tape, etc.

To input unit 10 connected are, in series, an analog/digital converter 20 and a first memory 30. A/D converter 20 is for converting an input analog signal into a digital signal, and first memory 30 is a sort of buffer memory for temporarily storing an audio signal so as to process it in a block unit. A digital signal processor (40) is connected to first memory 30, and is also linked with a controller 50 and an IC memory card 60. A mute section detector 70 is provided between DSP 40 and controller 50.

A second memory 90, located between IC memory card 60 and DSP 40 as a kind of buffer memory, temporarily stores in a certain unit the data output from IC memory card 60 to then output it is DSP 40 for block-unit processing therein.

DSP 40 plays a role of coding an audio signal which will be recorded on IC memory card 60, or decoding the audio signal read out from IC memory card 60, or decoding the audio signal read out from IC memory card 60. IC memory card 60 is divided into a data area and a table-of-contents (TOC) area, a minute format of which will be described in detail in regard to FIGS. 2A and 2C. Controller 50 controls DSP 40 according to a recording key 81, a stop key 82, an automatic chapter select key 83 connected thereto, and silence detection by mute section detector 70. Here, recording key 81 is selected for a start of recording, stop key 82 for ending the whole recording, and automatic chapter select key 83 for selecting/de-selecting automatic chapter partitioning according to the present invention.

A digital/analog converter 100, connected to receive digital signals from DSP 40, plays the role of converting an input digital signal into an analog signal. An output 110 is a speaker for outputting, as sound, a signal applied from D/A converter 100.

In the FIG. 1 apparatus, the audio signal recorded on the audio source, such as a compact disc or magnetic tape, is applied via input unit 10. The audio signal is digitalized in A/D converter 20 and then stored in first memory 30. DSP 40 reads out, in block units of a predetermined size, the audio signal stored in first memory 30, and codes the read-out audio signal. The coded data is recorded in the data area of IC memory card 60.

Meanwhile, mute section detector 70 detects a mute section by checking whether a period of silence in the audio signal is maintained for a predetermined time. When mute section detector 70 detects a mute section, controller 50 controls DSP 50 to stop a recording operation in the data area of IC memory card 60, and then to record the recording information regarding the audio signal recorded in the data area of IC memory card 60, in the TOC area of IC memory card 60. The recording information includes start addresses of each chapter, recording time of each chapter, total recording time of data recorded in the IC memory cart, etc. When a mute section ends and a sound section starts again, the above process is repeated.

The operation of FIG. 1 apparatus will be described in more detail in regard to FIG. 4.

Figure 2A:
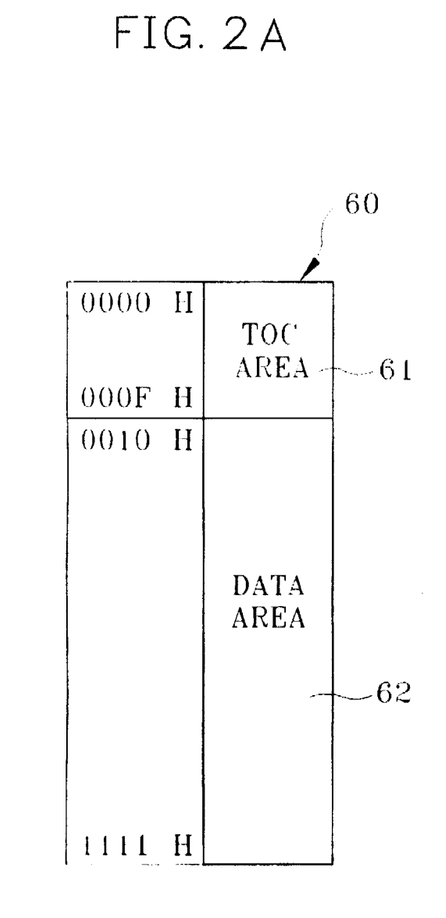
FIGS. 2A through 2C are views explaining formats of the IC memory card of FIG. 1.
Figure 2B:
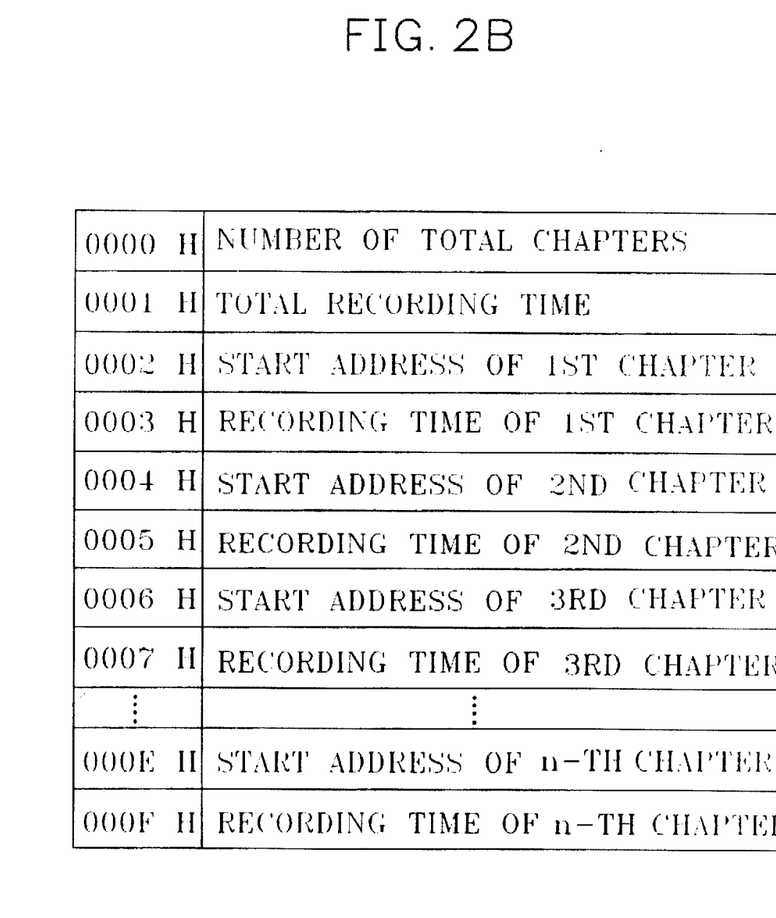
Figure 2C:
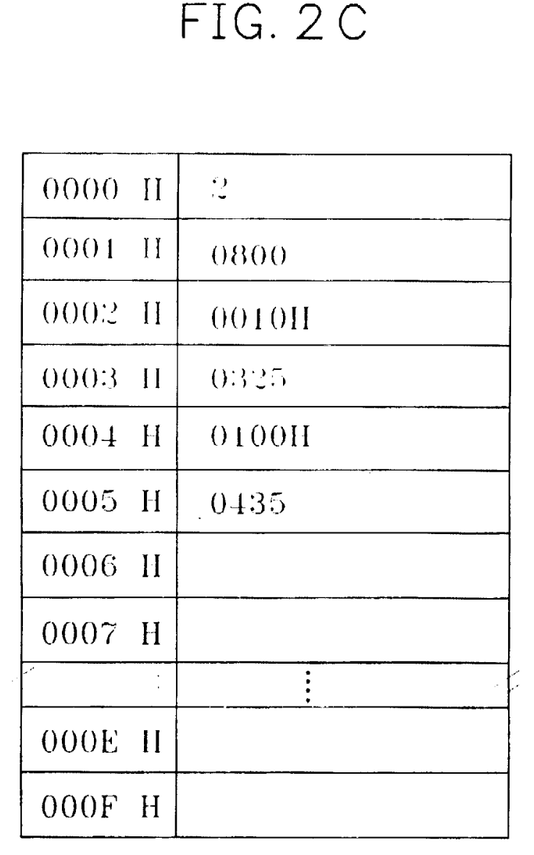

FIGS. 2A through 2C are views explaining formats of the IC memory card of FIG. 1 and FIG. 2A is a view showing an overall map of the IC memory card, FIG. 2B is a view showing a recording format of the TOC area of FIG. 2A and FIG. 2C is a view showing an example of the recording information of the audio signal in the TOC area of FIG. 2A.

As shown in FIG. 2A, IC memory card 60 is divided into a TOC area 61 and a data area 62. IC memory card of FIG. 2 has a memory size from 0000H to 1111H, in which a memory size of 0000H to 000FH are assigned to TOC area 61 and that of 0010H to 1111H are data area 62.

The recording format of TOC area 61 in FIG. 2A is shown in FIG. 2B. As shown in FIG. 2B, recorded in TOC area 61 are, in sequence, a number of the total chapters, total recording time, a start address of a first chapter, recording time of the first chapter, a start address of a second chapter, recording time of the second chapter, and so forth until the n-th chapter when a start address of n-th chapter, and recording time of the n-th chapter are recorded. Here, the number of the total chapters and total recording time are accumulated and recorded whenever each chapter is recorded. When time values are recorded, two lower digits record time in seconds, and a minutes are denoted in an upper digit.

An embodiment of the recording information recorded in TOC area 61 according to the format of FIG. 2B is shown in FIG. 2C, wherein a number of the total chapters is "2" and total recording time is 8 minutes. A start address of the first chapter is 0010H, and recording time of the first chapter is three minutes and twenty-five seconds. And a start address of the second chapter is 0100H, and recording time of the second chapter is four minutes and thirty-five seconds.

As shown in FIGS. 2A–2C, the start address of data corresponding to each chapter is recorded in the TOC area, and thus each chapter can be directly selected.

Figure 3:
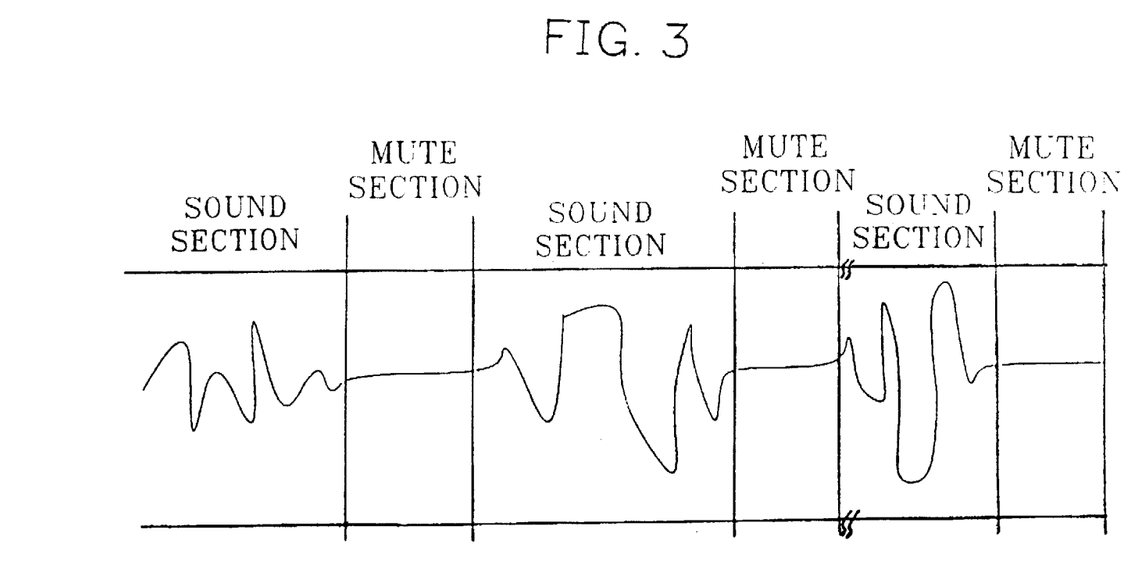
FIG. 3 is a waveform of a signal applied to an apparatus in accordance with the present invention.

FIG. 3 is a waveform view of a signal applied to the apparatus in accordance with the present invention. Referring to FIG. 3, the input audio signal is composed of a sound section including chapters and a mute section partitioning the audio signal into a chapter unit. The audio signal in the sound section is recorded in the data area of IC memory card. When the mute section starts, the recording information with regard to the sound section is recorded in the TOC area of IC memory card 60.

Figure 4A:
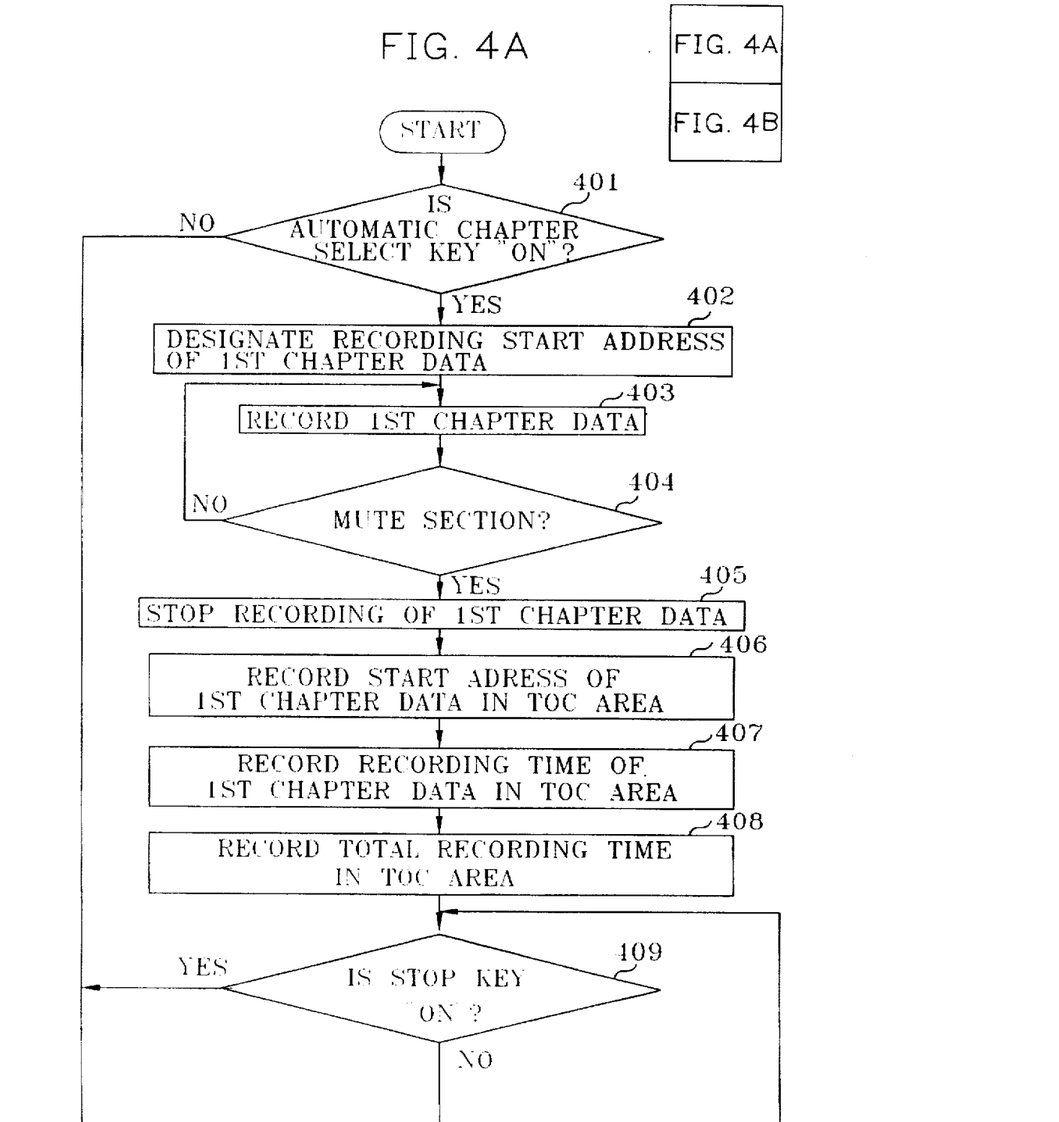
FIG. 4A to 4B are flowcharts illustrating a recording operation of an audio signal in the FIG. 1 apparatus.
Figure 4B:
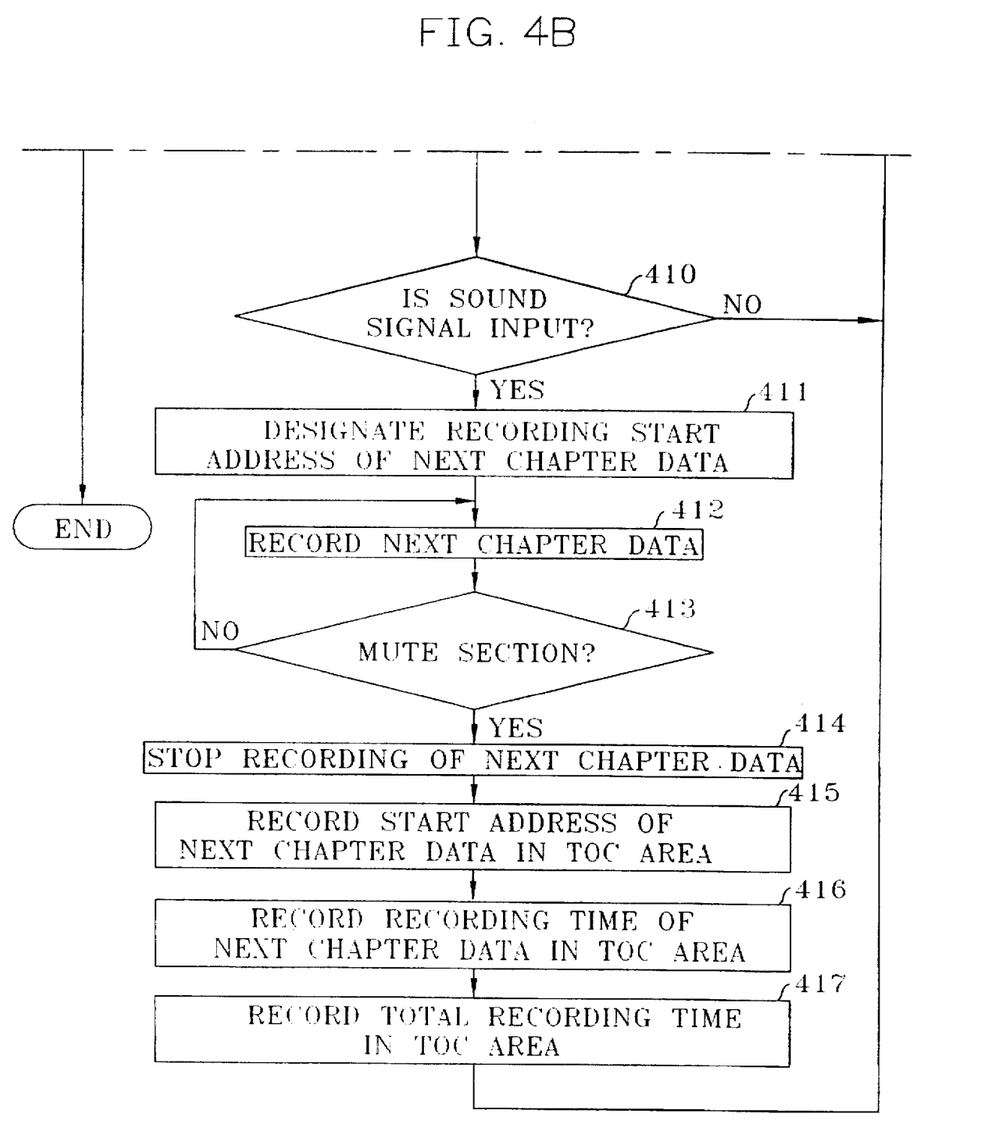

FIGS. 4A to 4B are flowcharts illustrating a recording operation of the audio signal in the FIG. 1 apparatus. First, it is confirmed whether an automatic chapter select key is in 'on' state in step 401. If the automatic chapter select key is not 'on', subsequent steps are omitted from the routine. If the automatic chapter select key is in 'on' state, controller 50 designates a start address where the first chapter data is recorded in step 402. And then, controller 50 records data of the first chapter in the data area of IC memory card in step 403. In step 404 a check is performed as to whether a silence period in the input audio signal is maintained during a predetermined time and if it has not, step 403 is repeated.

When the mute section of silence of sufficient duration is detected, recording of the first chapter data is stopped in step 405. Next, a recording start address and recording time of the first chapter data, and total recording time of data recorded in IC memory card are, in sequence, recorded in the TOC area of IC memory card in steps 406, 407 and 408.

After performing the above process, a judgement is made as to whether a stop key is in 'on' state in step 409. When the stop key is 'on', subsequent steps are omitted from the routine. Otherwise, a check is made whether the sound signal is input in step 410. If not, step 409 is iterated.

If the sound signal is input, a start address of a the next chapter is designated in step 411. Next, the audio signal of the next chapter is recorded in the data area of IC memory card in step 412. In step 413 a check is made whether mute section is detected, and if it is not step 412 is repeated until the mute section is detected, when the mute section is detected, recording of the next chapter data stops in step 414. Next, a recording start address and recording time of the next chapter data are, in sequence, recorded in the TOC area of IC memory card, and the total recording time accumulated in IC memory card is updated and recorded in steps 415, 416 and 417.

After performing the above process, if the stop key is 'on', returning to step 409, the process ends. Otherwise, the steps following step 410 are repeated with respect to subsequent chapters.

As described above, the FIG. 1 apparatus operates, when the automatic chapter select key is 'on', to partition and store as per chapter the audio signal composed of a plurality of chapters even when the recording key and stop key, have each been pressed only once each to, respectively, start and stop recordeing. This allows a desired chapter to be directly selected.

On the other hand, there can be a mute section even within a single chapter. According to the FIG. 1 apparatus, a single chapter containing a long silence will be stored as two distinct chapters, and their recording information are separately recorded in the TOC area of IC memory card. In this case, the recording information recorded in the TOC area of IC memory card should be corrected.

Thus, the present invention also provides a method and apparatus which allows more than two chapters adjoining to the TOC area of IC memory card to be consolidated as a single chapter.

Figure 5:
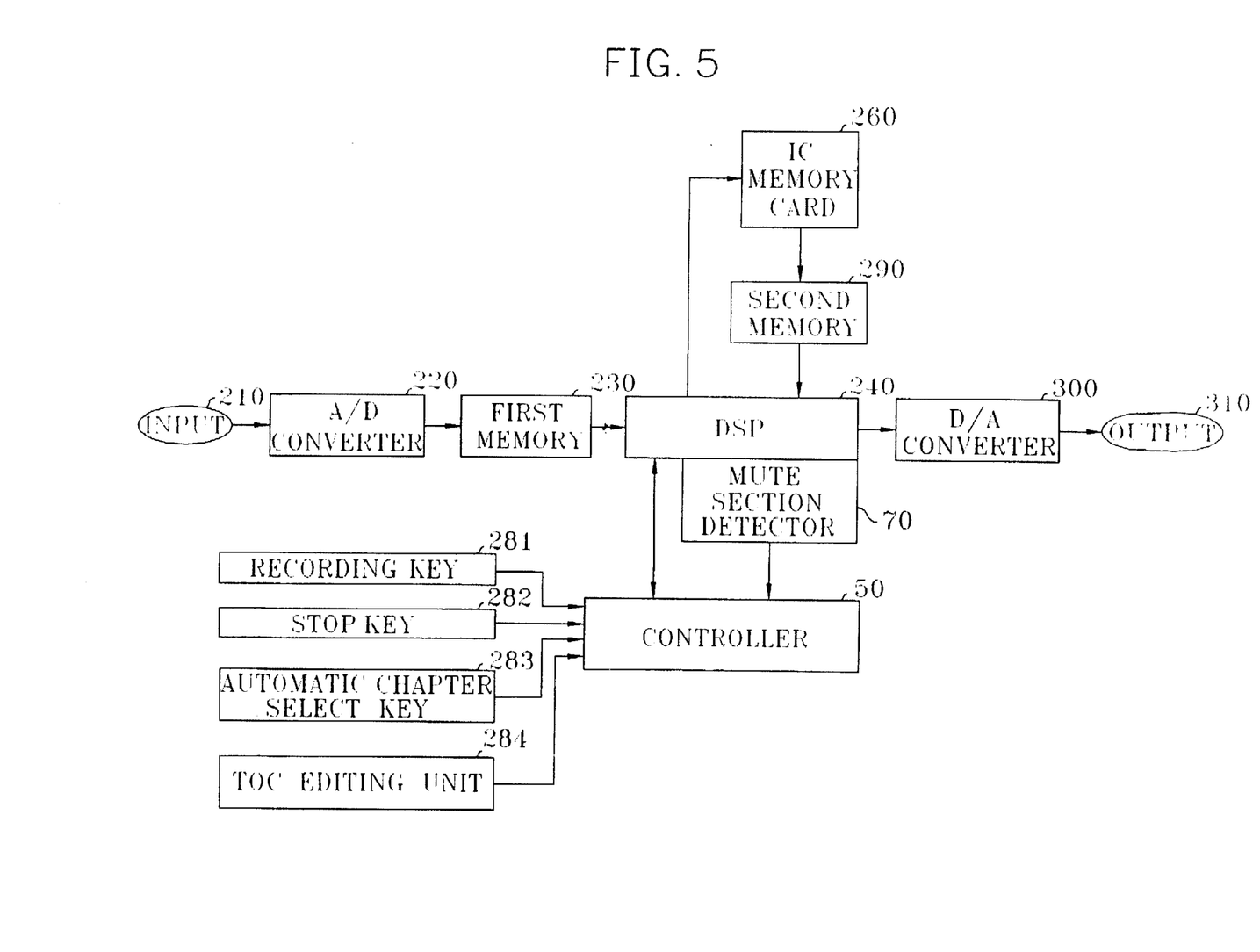
FIG. 5 is a block diagram showing a recording apparatus of an audio signal, using an integrated circuit (IC) memory card in accordance with another embodiment of the present invention.

FIG. 5 is a block diagram showing the recording apparatus of the audio signal, using the IC memory card in accordance with another embodiment of the present invention.

As shown in FIG. 5, the apparatus further comprises a TOC editing unit 284 for correcting recording information in the TOC area of an IC memory card 260. An output signal form TOC editing unit 284 is applied to controller 50, by a control signal of which the operation of a DSP 240 is controlled, and the recording information of the TOC area of IC memory card 260 is corrected.

An editing process for IC memory card 260 will be described in detail with reference to FIGS. 6A, 6B, and 7.

Figure 6A:
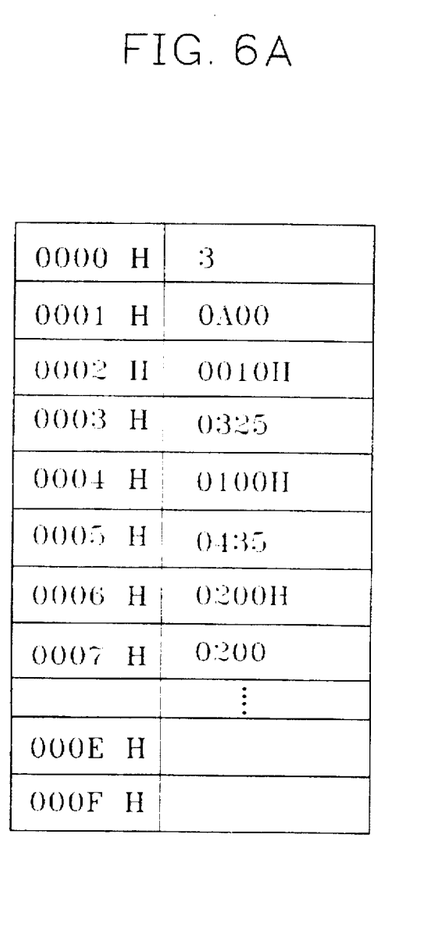
FIGS. 6A and 6B are views explaining an editing process in a table-of-contents (TOC) area of the IC memory card in accordance with the present invention.
Figure 6B:
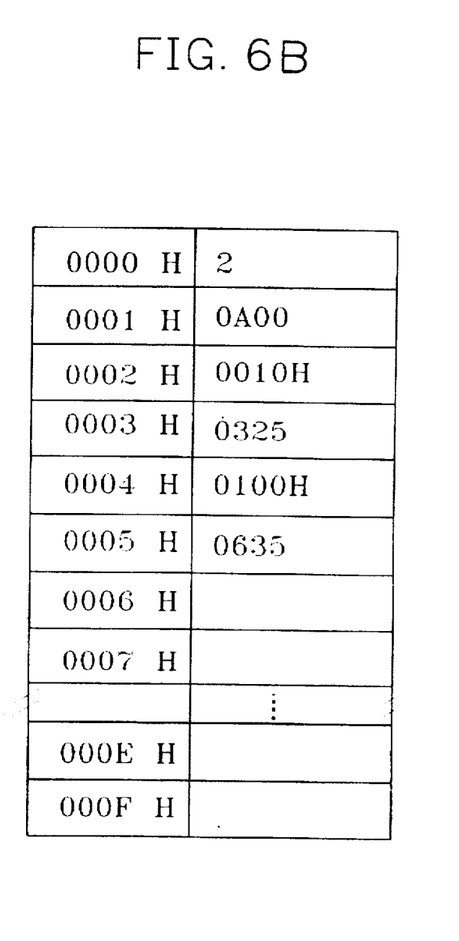

FIGS. 6A and 6B are views illustrating the editing process in the table-of-contents (TOC) area of IC memory card in accordance with the present invention. FIG. 6A is a view showing an example of recording information recorded in the TOC area of IC memory card 260. Referring to FIG. 6A, a number of the total chapters recorded in the data area of IC memory card 260 is "3", and the recording time is 10 minutes. A start address of a first chapter is 0010H, and recording time of the first chapter is three minutes and twenty-five seconds. And a start address of a second chapter of 0100H, and recording time of the second chapter is four minutes and thirty-five seconds. A start address of a third chapter is 0200H, and recording time of the third chapter is two minutes.

If it is intended to correct the recording by consolidating the second and third chapters as a single chapter, editing of the TOC area is required. FIG. 6B is a view showing a status that the TOC area of FIG. 6A is edited, and an editing process is as follows.

TOC editing unit 284 becomes 'on' in a condition when the FIG. 5 apparatus stops. Since the number of the total chapters is changed from 3 to 2, a "0000H" address is changed from 3 to 2. Meanwhile, since the total recording time recorded at a "0001H" address has no alteration, it remains the same. Also, both a "0002H" address in which recording information on the first chapter is stored and information recorded at a "0003H" address are left as they are. Since recording information recorded at a "0004H" address is a start address of the second chapter being not changed, it remains itself. On the other hand, the contents of the "0005H" address are changed to six minutes and thirty-five seconds. This value is obtained by adding the recording time of the second chapter prior to change, four minutes and thirty-five seconds, and that of the third chapter prior to change, two minutes. Next, the recording information on the third chapter recorded at "0006H" and "0007H" addresses is deleted from the TOC area.

Figure 7:
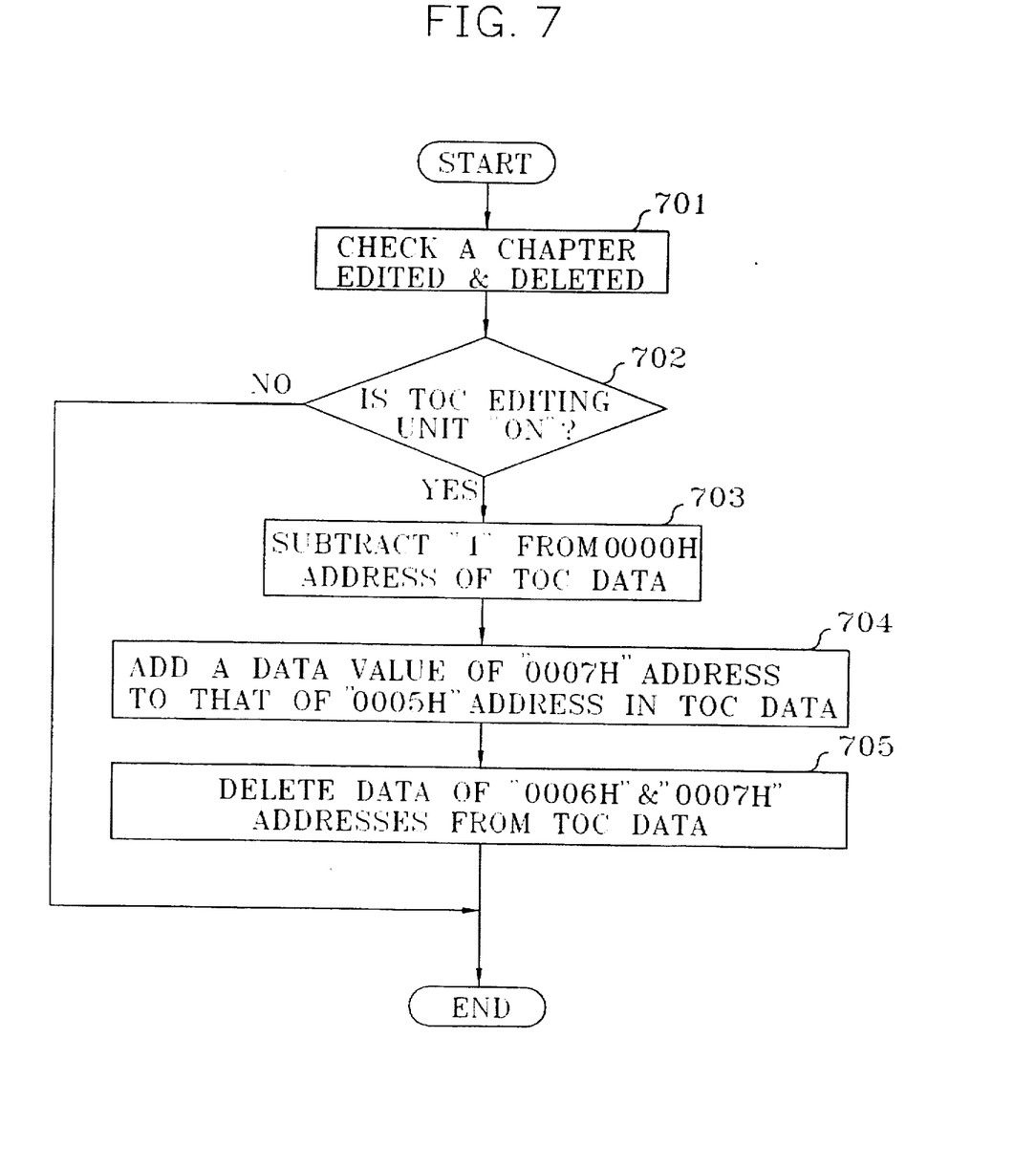
FIG. 7 is a flowchart illustrating an editing process shown in FIGS. 6A and 6B.

FIG. 7 is a flowchart illustrating the editing process shown in FIGS. 6. First, it is confirmed in step 701 whether the third chapter is to be edited and deleted. Next, it is confirmed in step 702 whether a TOC editing unit is 'on'. If the TOC editing unit is not 'on', TOC editing ends. If TOC editing unit is 'on', "1" is subtracted from the number of the total chapters recorded at "0000H" address in step 703. A data value of the "0005H" address is added to that of the "0007H" address to thereby correct and record the "0005H" address in step 704. Next, data of the "0006H" and "0007H" addresses are deleted in step 705.

As described above, the present invention provides a method and apparatus for recording an audio signal having mute sections between adjoining chapters on an IC memory card. The invention provides a recording method and apparatus of the audio signal using the IC memory card, capable of automatically partitioning and recording chapters as they are continuously recorded by selection with an automatic chapter select key. The invention further comprises a TOC editing unit for correcting recording information of the TOC area of IC memory card.

While only certain embodiments of the invention have been specifically described herein, it will apparent that numerous modifications may be made thereto without departing from the spirit and scope of the invention.

What is claimed is:

1. A method of recording an audio signal on an integrated circuit (IC) memory card, the audio signal having chapters with mute sections between adjoining chapters, the recording method comprising the steps of:

(a) recording a first chapter in the audio signal in a data area of the IC memory card;

(b) detecting a mute section in the audio signal based upon whether a period of silence is maintained for a predetermined time in said step (a);

(c) stopping recording of said first chapter when the mute section is detected in said step (b), and recording information regarding said first chapter in a table-of-contents (TOC) area of said IC memory card; and (d) partitioning subsequent chapters, recording each subsequent chapter of the audio signal in the data area, and recording the recording information of each subsequent chapter in the TOC area, by the repetition of the process in said steps (a) through (c) with regard to the subsequent chapters of the audio signal, until all chapters of the audio signal are recorded.

2. The recording method according to claim 1, wherein said step (c) comprises the sub-steps of:

(c1) recording a start addresses where data of the first chapter starts to be recorded;

(c2) recording the recording time of the first chapter;

(c3) recording the number of the total chapters recorded in said IC memory card; and (c4) recording total time of the audio signal recorded in said IC memory card.

3. The recording method according to claim 2, further comprising the step of:

(e) editing the recording information recorded in said TOC area.

4. The recording method according to claim 3, wherein said editing step comprises the sub-steps of:

(e1) correcting the number of the total chapters;

(e2) correcting the recording time of chapters to be edited; and (e3) deleting unnecessary recording information.

5. An apparatus for recording an audio signal on an integrated circuit (IC) memory card, the audio signal having chapters with mute sections between adjoining chapters, the recording apparatus comprising:

detection means for detecting a mute section of said audio signal to produce a detection result;

recording means for recording the audio signal in a data area of said IC memory card according to whether or not said mute section is detected, and recording information regarding the audio signal recorded in the data area of said IC memory card in a table-of-contents (TOC) area of said IC memory card; and control means for controlling an operation of said recording means according to a predetermined input signal and the detection result from said detection means.

6. The recording apparatus according to claim 5, wherein said recording means records, in the TOC area, start addresses and recording time with regard to each chapter of the audio signal which have been recorded in the data area of said IC memory card, and recording total time of the audio signal recorded in the data area of said IC memory card.

7. The recording apparatus according to claim 6, further comprising editing means for editing information recorded at the TOC area.

* * * * *